United States Patent
Warner et al.

(10) Patent No.: US 6,563,350 B1
(45) Date of Patent: May 13, 2003

(54) TIMING SIGNAL GENERATOR EMPLOYING DIRECT DIGITAL FREQUENCY SYNTHESIS

(75) Inventors: Charles C. Warner, Forest Grove, OR (US); Bryan J. Dinteman, Canby, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 10/102,111

(22) Filed: Mar. 19, 2002

(51) Int. Cl.[7] .............................................. H03B 21/00
(52) U.S. Cl. ..................... 327/107; 327/105; 324/76.39
(58) Field of Search ................... 327/105, 106, 327/107, 129; 324/73.1, 76.39, 76.48

(56) References Cited

U.S. PATENT DOCUMENTS

| | | | | |
|---|---|---|---|---|
| 5,390,192 A | * | 2/1995 | Fujieda | 371/27 |
| 5,959,479 A | * | 9/1999 | Woodward | 327/160 |
| 6,348,785 B2 | * | 2/2002 | Wohlfarth | 324/73.1 |
| 6,356,224 B1 | * | 3/2002 | Wohlfarth | 341/147 |

* cited by examiner

*Primary Examiner*—Timothy P. Callahan
*Assistant Examiner*—An T. Luu
(74) *Attorney, Agent, or Firm*—Daniel J. Bedell; Smith-Hill and Bedell

(57) ABSTRACT

A timing signal generator including a direct digital frequency synthesizer (DDFS), a divide-by-N counter, and a pattern generator, produces a TIMING signal conveying a timed sequence of pulses. The pattern generator produces a sequence of data pairs (FREQ,N), with each pair being produced in response to each pulse of the TIMING signal and indicating a time interval that is to occur between that TIMING signal pulse and a next TIMING signal pulse. The DDFS produces an output sine wave signal (SINE) having a frequency controlled by the current FREQ data output of the pattern generator. The divide-by-N counter produces the timing signal pulses. It counts cycles of the SINE signal occurring since it last produce a TIMING signal pulse and generates a next TIMING signal when it has counted the number of SINE signal pulses indicated by the current N data output of the pattern generator.

14 Claims, 3 Drawing Sheets

TIMING SIGNAL GENERATOR EMPLOYING DIRECT DIGITAL FREQUENCY SYNTHESIS

BACKGROUND OF THE INVENTION

1. Field of the Invention

The present invention relates in general to a timing signal generator that uses a direct digital frequency synthesizer to control the period between successive pulses of its output timing signal.

2. Description of Related Art

Timing signal generators produce output pulses at controlled intervals that are useful for initiating events. For example, an integrated circuit (IC) tester transmits test signals to an IC device under test (DUT) and samples DUT output signals to determine whether the DUT is behaving as expected. A tester uses timing signals to initiate state changes in the test signals and to trigger the sampling of DUT output signals. To be able to test increasingly higher frequency digital integrated circuits, testers need increasing higher frequency timing signal generators that can control the timing of signal pulse edges with increasingly higher accuracy and resolution.

FIG. 1 illustrates a simple prior art timing signal generator employing a divide-by-N counter 10 and a pattern generator 12. Counter 10 produces a TIMING signal pulse in response to every N pulses of a periodic clock signal (ROSC) produced by a stable reference oscillator. A programmable pattern generator 12 clocked by the TIMING signal generators a sequence of data values that controls the count limit N of counter 10. In response to a pulse of an input START signal counter 10 counts the number N of ROSC signal pulses indicated by the data output of pattern generator 12 and then produces a first pulse of the TIMING signal. That timing pulse tells pattern generator 12 to supply a next value of N to counter 10. Thus the value of N pattern generator 12 produces in response to each TIMING signal pulse controls the time interval between that timing signal pulse and the next. Accordingly pattern generator 12 must be capable of producing a separate N data value for each successive pulse of the TIMING signal.

Note that the timing resolution of the timing signal generator of FIG. 1 is equal to the period PR of the ROSC signal since all TIMING signal pulses will have the same phase relative to the ROSC signal.

FIG. 2 illustrates a higher resolution timing signal generator which also employs a divide-by-N counter 14 controlled by a pattern generator 16. However the output T0 of counter 14 is applied to a tapped delay line 18 formed by a series of M−1 logic gates 20, each delaying the T0 signal by $P_{ROSC}/M$ to produce a set of tap signals T1–T(M−1). Signals T0–T(M−1) drive inputs of a multiplexer 20 which responds to an input value K by selecting the Kth tap signal to drive the TIMING signal. Pattern generator 16, clocked by the T0 signal, updates the values of N and K on each TIMING signal pulse. Thus the timing signal generator of FIG. 2 can place TIMING signal edges with a resolution of 1/Mth of the period of the ROSC signal.

One difficulty with the use of tapped delay line 18 is that it is difficult to accurately control the delays of gates so that each gate has a delay of 1/Mth of the period of the ROSC signal since gate delays are subject to temperature and process variations. Thus while the timing signal generator of FIG. 2 may have high resolution, the difficulty in controlling the delays of gates 20 can render it somewhat inaccurate.

FIG. 3 illustrates a more inherently accurate timing signal generator that also includes a divide-by-N counter 22, a pattern generator 24, a tapped delay line 26 and a multiplexer 28. In this circuit, pattern generator 24 supplies the value of K to multiplexer 28 but does not supply the value of N to divide-by-N counter 22; the value of N is fixed and does not change on the fly after the timing signal generator starts generating the TIMING signal in response to a START signal pulse. Thus the T0 signal has a fixed period that is 1/Nth that of the ROSC signal. Tapped delay line 26 has M gates 32 so that the last (Mth) tap signal TM will be in phase with the T0 output of divide-by-N counter 22 when the average delay of each of the M gates 32 is 1/Mth that of the T0 signal. The delay of each gate 32 is a function of its switching speed, and the gate's switching speed is in turn a function the voltage of an input control signal CONT. A phase lock controller 30 compares the phases of the T0 and TM signals and adjusts the delay of gates 32 by adjusting the CONT signal voltage to keep the TM signal in phase with the T0 signal. This ensures that the average delay provided by gates 32 is 1/Mth the period of the T0 signal. This phase locking system keeps the delay of gates 32 stable regardless of temperature changes in the IC implementing delay line 18. Thus the timing signal generator of FIG. 3 is inherently more accurate than the timing signal generator of FIG. 2. However since the delay of each gate 20 of FIG. 2 is 1/Mth of the ROSC signal period while the delay of each gate 32 of FIG. 3 is N/Mth of the ROSC signal period, the resolution of the signal generator of FIG. 3 is lower than the resolution of the signal generator of FIG. 2 unless the value of N is set to one.

Since phase lock controller 30 uses feedback to control the delay of gates 32, the inherent delay of its feedback loop can cause some jitter (variation) in the timing of edges. Timing signal inaccuracies also arise because process and temperature variations from gate-to-gate on the same IC will cause logic gates 32 to have slightly differing delays.

The timing signal generator of FIG. 3 also "cyclizes" the TIMING signal in the sense that the TIMING signal is restricted to having no more than one pulse every N cycles of the ROSC signal, where N is a fixed value. During any of the N cycle periods of the ROSC signal in which the TIMING signal is not to convey a pulse, pattern generator 24 must tell multiplexer 28 not to drive the TIMING signal with any of its input tap signals. Thus while pattern generator 16 of FIG. 2 must include one N,K pair for each pulse of the TIMING signal to be produced, pattern generator 24 must include one K data value for every N cycles of the ROSC signal, regardless of the number of TIMING signal pulses to be produced. Hence when we try to increase resolution with which pulses of the TIMING signal are timed by reducing the value of N, we increase the length of the data sequence pattern generator 24 must produce. Thus the value of N supplied to counter 22 represents a trade-off between timing resolution and the sequence generating capacity of pattern generator 24.

What is needed is an accurate, high resolution, high frequency timing signal generator that makes efficient use of pattern generation resources and which does not rely on logic gate delay controlled by phase lock feedback as references for controlling intervals between output signal pulses.

BRIEF SUMMARY OF THE INVENTION

A timing signal generator in accordance with the invention includes a direct digital frequency synthesizer (DDFS), a divide-by-N counter, and a pattern generator to produce a TIMING signal conveying a timed sequence of pulses.

The pattern generator produces data pair (FREQ,N) in response to each pulse of the TIMING signal and that data pair indicates a time interval that is to occur before a next TIMING signal pulse.

The DDFS, using a stable high frequency reference clock signal (ROSC) as a timing reference, generates an analog output sine wave signal (SINE) having a frequency controlled by the current FREQ data output of the pattern generator.

The divide-by-N counter produces the timing signal pulses. It counts cycles of the SINE signal occurring since it last produce a TIMING signal pulse and generates a next TIMING signal when it has counted the number of SINE signal pulses indicated by the current N data output of the pattern generator.

Thus successive (FREQ, N) pairs produced by the pattern generator control the duration of the interval preceding each successive pulse of the TIMING signal. The FREQ data controls the frequency (and therefore the period) of the SINE signal produced by the DDFS, while the N data controls the number of SINE signal periods the counter is to wait before generating the next TIMING signal pulse.

Unlike typical prior art timing signal generators, a timing signal generator in accordance with the invention does not rely on logic gate delays controlled by phase lock feedback as references for controlling intervals between TIMING signal pulses. Thus the TIMING signal is not subject to pulse timing inaccuracies arising from jitter due to temperature and process variations affecting gate delays or due to oscillations in a feedback control circuit controlling gate delays. When the DDFS is implemented using high speed semiconductor technology capable of responding, for example, to a 100 GHz ROSC signal to produce an output SINE signal in the range of 2.5 to 5 GHz, the timing signal generator in accordance with the invention can provide sub-picosecond timing resolution with very little jitter. Also since the spectral content of the TIMING signal is entirely predictable, the dominant form of jitter is periodic rather than random. Thus, for example, when the timing signal generator is employed to clock a digitizer, the digitizer's output data can be processed to correct for the predictable jitter in the TIMING signal.

The claims portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DETAILED DESCRIPTION OF THE INVENTION

Figure 4:
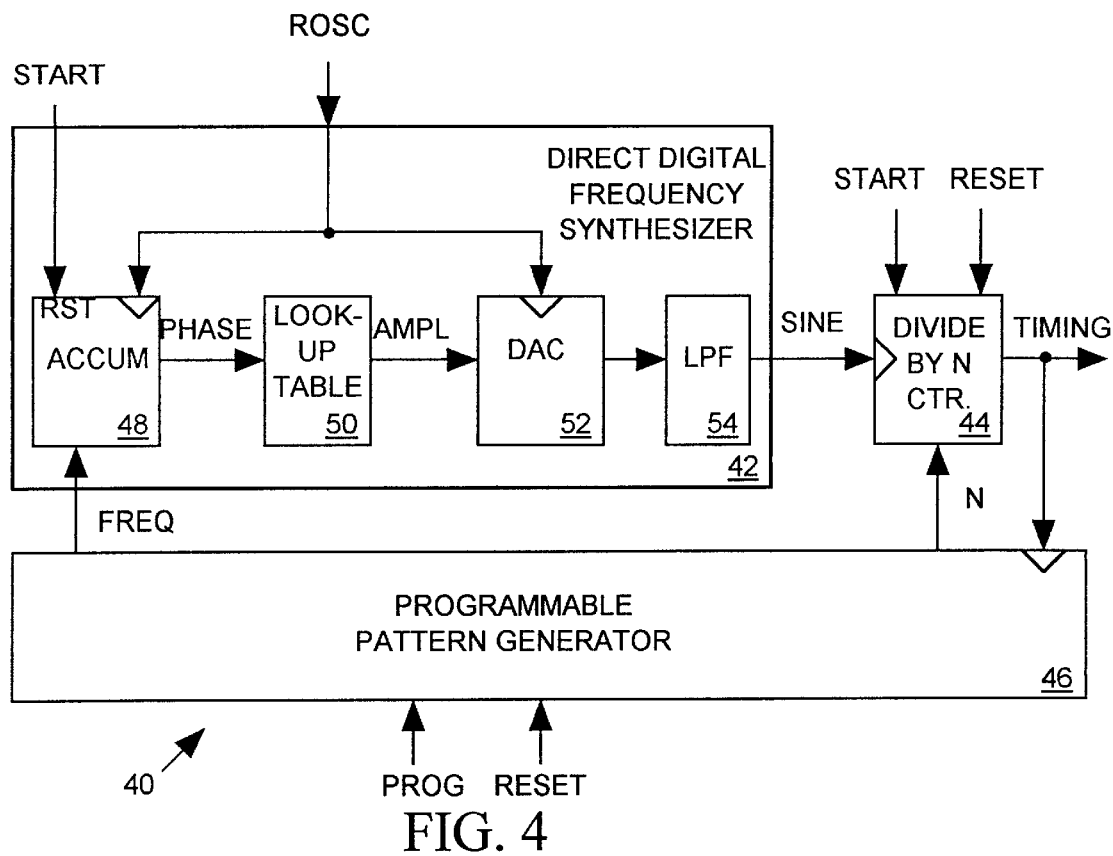
FIG. 4 illustrates a timing signal generator 40 in accordance with the invention in block diagram form.
Figure 5:
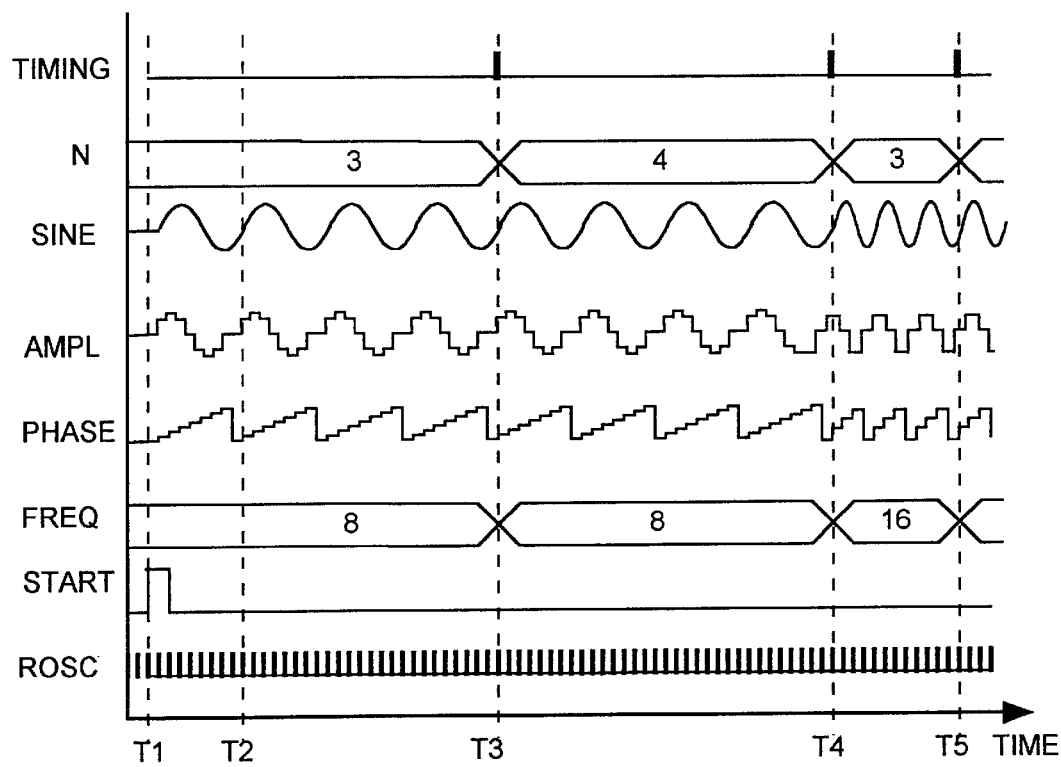
FIG. 5 is a timing diagram illustrating behavior of various signals of the timing signal generator 40 of FIG. 4.

FIG. 4 illustrates a timing signal generator 40 in accordance with the invention for producing an output timing signal (TIMING) having pulses occurring at controlled intervals. FIG. 5 is a timing diagram illustrating behavior of various signals of the timing signal generator 40 of FIG. 4. Referring to FIGS. 4 and 5, timing signal generator 40 includes a direct digital frequency synthesizer (DDFS) 42, a divide-by-N counter 44 and a pattern generator 46. Programming data supplied as input to pattern generator 46 defines a sequence of data pairs (FREQ,N) the pattern generator is to generate and provide as input to DDFS 42 and divide-by-N counter 44. Each pulse of the TIMING signal clocks pattern generator 46 telling it to generate a next (FREQ,N) data pair, and each data pair defines a time interval between the current pulse of the TIMING signal and a next pulse of the timing signal. DDFS 42 generates a periodic analog output signal, suitably a sine wave signal (SINE), having a frequency controlled by the current FREQ data output of pattern generator 46. Divide-by-N counter 44 counts the number of cycles of the SINE signal by detecting when it rises above a threshold level, and produces a pulse of the TIMING signal after it has detected a number of cycles of the SINE signal indicated by the current N data output of pattern generator 46.

After pattern generator 46 has been programmed, a RESET signal resets counter 44 and signals pattern generator 46 to produce an initial (FREQ,N) data pair. For example, as illustrated in FIG. 5, pattern generator 46 can be programmed to produce the sequence of (FREQ,N) data pairs: (8,3), (8,4) and (16, 3) to define timing of three successive TIMING signal pulses. A START signal at time T1 tells counter 44 to begin counting down from N (initially having value 3) in response to each detected cycle of the SINE signal. The START signal also resets the PHASE output of accumulator 48 to zero. Counter 44 starts counting down after it detects a next SINE signal zero crossing at time T2. The first TIMING signal pulse at time T3 tells pattern generator 46 to generate a next (FREQ,N) pair of value (8,4). Since the FREQ value remains unchanged, the SINE signal frequency remains unchanged, but since N has been changed from 3 to 4, counter 44 now counts four cycles of the SINE signal before generating a next pulse of the TIMING signal at time T4. Pattern generator 46 responds to the TIMING signal pulse at time T4 by providing a next (FREQ,N) data pair of value (16,3). Since the FREQ value has increased from 12 to 16, DDFS 42 increases the frequency of the SINE signal. Counter 44 then counts N=3 cycles of the SINE signal and produces a next pulse of the TIMING signal at time T5.

This process can continue for as long as pattern generator 46 can continue to supply (FREQ,N) data pairs. A pulse of the RESET signal resets counter 44 and stops it from generating TIMING signal pulses until it receives a next START signal pulse. The RESET signal also resets pattern generator 46 and tells it to start the sequence over again on the next START signal pulse.

Timing signal generator 40 produces a TIMING signal in which the period between its edges can be adjusted with a resolution much smaller than the period of the ROSC signal. However the resolution with which the delay between the START signal and the first edge of the TIMING signal can be predicted depends on whether the START and ROSC signals are coherent. The signals are coherent when the timing of the START signal edge always has a predictable phase relationship to the next ROSC signal edge. When the START signal and ROSC signal are coherent, then the delay between the START signal and the first edge of the TIMING signal is adjustable with a resolution much smaller than the period of one ROSC signal pulse. However if the START and ROSC signals are not coherent, then the delay between the START signal edge and the first TIMING signal edge is adjustable with a resolution of one period of the ROSC signal.

The conventional DDFS 42 includes an accumulator 48, a look-up table 50 (for example a read only memory or a register file), a digital-to-analog converter (DAC) 52, and a low pass filter (LPF) 54. An externally generated, periodic clock signal (ROSC) clocks accumulator 48 which produces, for example, an 8-bit output data sequence (PHASE). Accumulator 48 increments the PHASE data in response to each pulse of the ROSC signal by the value of the FREQ data from pattern generator 46 so that the PHASE data sequence (as illustrated in FIG. 5) appears as a digital representation of a periodically repeated ramp signal having a frequency controlled by the FREQ data input to the accumulator. Lookup table 50 produces a separate output data value (AMPL) for each of the 256 possible values of its input PHASE data from accumulator 48. As illustrated in FIG. 5, lookup table 50 responds to the PHASE data sequence by producing an output AMPL data sequence that is a digital representation of a sine wave signal having a frequency matching that of the PHASE data. DAC 52, clocked by the ROSC signal, converts the AMPL data into an analog waveform that is a stepwise approximation of a sine wave signal having the same frequency as the AMPL signal, and LPF 54 smoothes that analog waveform to produce the SINE signal. Thus the FREQ data supplied to accumulator 48 controls the frequency of the SINE signal output of DDFS 42.

Figure 6:
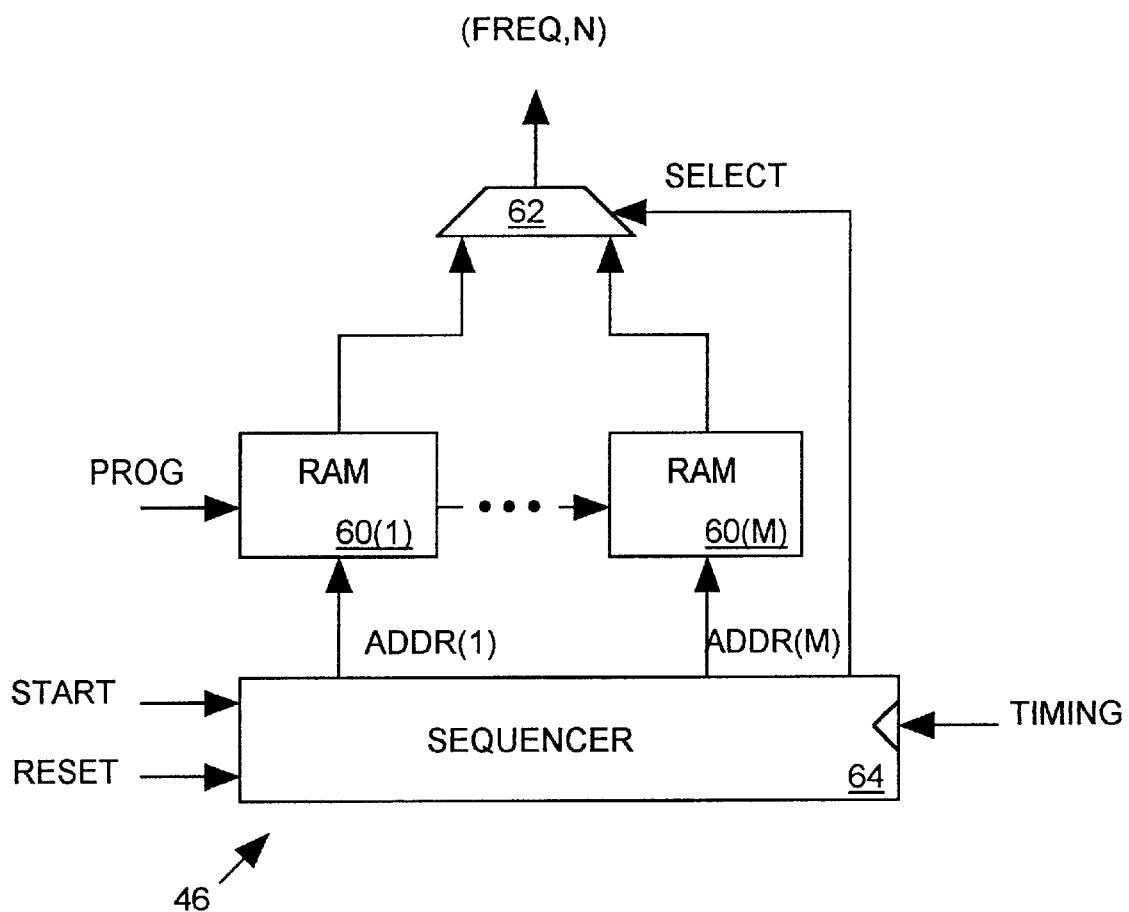
FIG. 6 illustrates the pattern generator of FIG. 4 in more detailed block diagram form.

FIG. 6 illustrates pattern generator 46 of FIG. 4 in more detailed block diagram form. Pattern generator 46 includes a set of M (two or more) random access memories (RAMs) 60(1)–60(M), a multiplexer 62 and a sequencer 64. The input programming data includes a separate sequence of (FREQ,N) data pairs each of which is written into a separate storage location of RAMs 60(1)–60(M) so that each RAM 60(1)–60(M) stores a separate sequence of (FREQ,N) data pairs at successive addresses. After being reset by the RESET signal, sequencer 64 sets an input address ADDR (1)–ADDR(M) to each RAM 60(1)–60(M) to 0 so that each RAM reads out the (FREQ,N) data pair stored at its address 0. The (FREQ,N) data pair read out of each RAM 60(1)–60(M) drives a separate input of multiplexer 62. Sequencer 64 initially sets multiplexer 62 to provide the (FREQ,N) data pair output of RAM 60(1) as initial (FREQ,N) data pair input to DDFS 42 and counter 44 of FIG. 4.

After receiving a START signal pulse, sequencer 64 responds to a next TIMING signal pulse by signaling multiplexer 62 to select the (FREQ,N) data pair output of RAM 60(2) and by incrementing the address input ADDR(1) to RAM 60(1) so that it reads out the (FREQ,N) data pair at address 1. On receiving a second TIMING signal pulse, sequencer 64 signals multiplexer 62 to select the (FREQ,N) data pair output of RAM 60(3) and increments the address input ADDR(2) to RAM 60(2) so that it reads out the (FREQ,N) data pair at its address 1. After multiplexer 62(M) selects the output of RAM (M), the on the next TIMING signal pulse, sequencer 64 signals multiplexer 62 to again select the output of RAM 60(1) and increments the address input ADDR(M) of RAM 60(M). Sequencer 64 repeats the process of selecting each RAM 60(1)–60(M) in turn and incrementing the preceding RAM address until it receives a next RESET pulse. At that point it resets all RAM addresses to 0 and waits for a next START signal pulse. RAMs 60(1)–60(M) can have relatively slow access times compared to the maximum possible frequency of the TIMING signal since each RAM reads out a data pair only once every M pulses of the TIMING signal.

Figure 1:
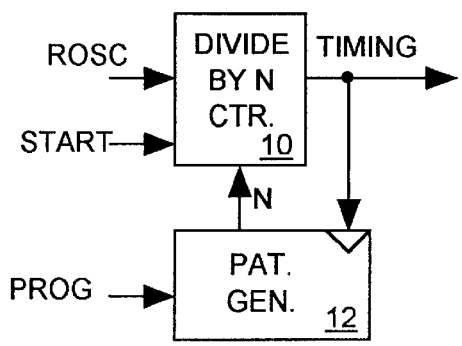
FIGS. 1–3 illustrate prior art timing signal generators in block diagram form.
Figure 2:
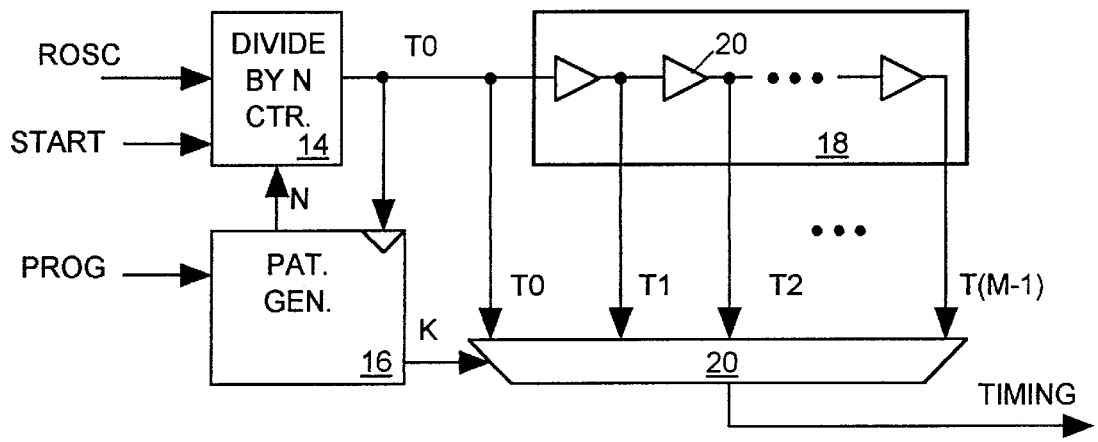
Figure 3:
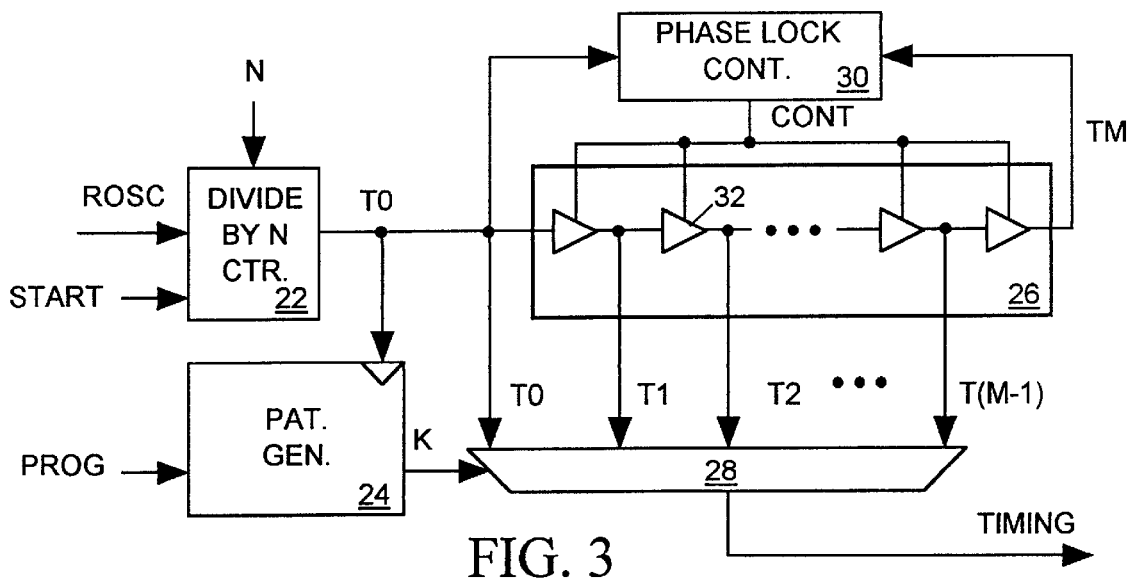

Unlike the prior art timing signal generator of FIG. 3, timing signal generator 40 of FIG. 4 does not rely on logic gate delays controlled by phase lock feedback to control TIMING signal pulse timing. Thus the timing of pulses of its output TIMING signal is not subject to jitter that can arise from temperature and process variations affecting gate delays or from oscillations in a feedback control circuit. When DDFS 42 of FIG. 4 is implemented using high speed semiconductor technology capable of responding, for example, to a 100 GHz ROSC signal to produce an output SINE signal in the range of 2.5 to 5 GHz, timing signal generator 40 can provide sub-pico second timing resolution with very little random jitter.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for generating a timing signal conveying a sequence of timing signal pulses in response to a reference signal periodically conveying reference pulses, the timing signal generator comprising:

a pattern generator for generating a separate data pair in response to each timing signal pulse, wherein each data pair comprises a first data value (FREQ) and a second data value (N);

a digital frequency synthesizer for producing a periodic first analog signal, wherein the first analog signal has a frequency selected by the first data value (FREQ) of the pattern generator's most recently generated data pair; and a divide-by-N counter for counting cycles of the periodic first analog signal occurring since a last produced timing signal pulse, and for producing a next TIMING signal pulse when it has counted a number of cycles of the first analog signal indicated by the second data value (N) of the pattern generator's most recently produced data pair.

2. The apparatus in accordance with claim 1 wherein the first analog signal has an amplitude varying sinusoidally with time.

3. The apparatus in accordance with claim 1 wherein the digital frequency synthesizer comprises:

an accumulator clocked by each pulse conveyed by the reference signal for accumulating a phase data with increments controlled by the first data value (FREQ) of the pattern generator's most recently generated data pair;

a look-up table for responding to the accumulated phase data by producing a periodically varying amplitude data sequence;

a digital-to-analog converter for converting the periodically varying amplitude data sequence into a second analog signal, and a filter for filtering the second analog signal to produce the first analog signal.

4. The apparatus in accordance with claim 3 wherein the first analog signal has an amplitude varying sinusoidally with time.

5. The apparatus in occurrence with claim 1 wherein the pattern generator comprises:

a plurality of addressable memories, each storing a data pair at a separate address and, each receiving separate address data referencing one of its addresses, and each reading out the data pair stored at the address referenced by its received address data;

a multiplexer having separate inputs for receiving the data pairs read out of the addressable memories, for selecting a data pair supplied to one of its inputs in response to selection control data, and for providing the selected data pair as the pattern generator's output data pair; and sequencing means for supplying the separate address data to each addressable memory and for supplying the selection control signal to the multiplexer.

6. The apparatus in accordance with claim 5 wherein the sequencing means alters the selection control data and the address data supplied the addressable memories in response to timing signal pulses.

7. The apparatus in accordance with claim 6 wherein the first analog signal has an amplitude varying sinusoidally with time.

8. The apparatus in accordance with claim 1 wherein the first analog signal has an amplitude varying sinusoidally with time;

wherein the digital frequency synthesizer comprises:

an accumulator clocked by each pulse conveyed by the reference signal for accumulating a phase data with increments controlled by the first data value (FREQ) of the pattern generator's most recently generated data pair;

a look-up table for responding to the accumulated phase data by producing a periodically varying amplitude data sequence;

a digital-to-analog converter for converting the periodically varying amplitude data sequence into a second analog signal, and a filter for filtering the second analog signal to produce the first analog signal; and wherein the pattern generator comprises:

a plurality of addressable memories, each storing a data pair at a separate address and, each receiving separate address data referencing one of its addresses, and each reading out the data pair stored at the address referenced by its received address data;

a multiplexer having separate inputs for receiving the data pairs read out of the addressable memories, for selecting a data pair supplied to one of its inputs in response to selection control data, and for providing the selected data pair as the pattern generator's output data pair; and sequencing means for supplying the separate address data to each addressable memory and for supplying the selection control signal to the multiplexer, wherein the sequencing means alters the selection control data and the address data supplied the addressable memories in response to timing signal pulses.

9. A method for generating a timing signal conveying a sequence of timing signal pulses in response to a reference signal periodically conveying reference pulses, the method comprising the steps of:

a. providing a data pair in response to each timing signal pulse, wherein each data pair comprises a first data value (FREQ) and a second data value (N);

b. producing a periodic first analog signal, wherein the first analog signal has a frequency selected by the first data value (FREQ) of a data pair most recently provided at step a; and c. counting cycles of the periodic first analog signal occurring since a last produced timing signal pulse, and for producing a next TIMING signal pulse after counting a number of cycles of the first analog signal indicated by the second data value (N) of the data pair most recently generated at step a.

10. The method in accordance with claim 9 wherein the first analog signal has an amplitude varying sinusoidally with time.

11. The method in accordance with claim 9 wherein step b comprises the substeps of:

b1. accumulating phase data with increments controlled by the first data value (FREQ) of the data pair most recently generated at step a;

b2. producing a periodically varying amplitude data sequence in response to the phase data produced at step b1;

b3. converting the periodically varying amplitude data sequence into a second analog signal, and b4. filtering the second analog signal to produce the first analog signal.

12. The method in accordance with claim 11 wherein the first analog signal has an amplitude varying sinusoidally with time.

13. The method in occurrence with claim 9 wherein step a comprises the substeps of:

a1. storing a separate data pair in each of a plurality of addressable storage locations of each of a plurality of addressable memories, a2. supplying separate address data to each addressable memory referencing one of its addresses such that each addressable memory reads out the data pair stored at the address referenced by its received address data, a3. selecting the data pair read out of each of the memories in turn in response to each of successive timing signal pulses as the data pair provided by step a, and a4. altering the address data supplied to each of the addressable memories in response to each of the successive timing signal pulses.

14. The method in accordance with claim 9 wherein the first analog signal has an amplitude varying sinusoidally with time;

wherein step a comprises the substeps of:

a1. storing a data pair in addressable storage locations of a plurality of addressable memories, a2. supplying separate address data to each addressable memory referencing one of its addresses such that each addressable memory reads out the data pair stored at the address referenced by its received address data, a3. selecting the data pair read out of each of the memories in turn in response to each of successive timing signal pulses as the data pair provided by step a, and a4. altering the address data supplied to each of the addressable memories in response to each of the successive timing signal pulses; and wherein step b comprises the substeps of:

b1. accumulating phase data with increments controlled by the first data value (FREQ) of the data pair most recently generated at step a, b2. producing a periodically varying amplitude data sequence in response to the phase data produced at step b1, b3. converting the periodically varying amplitude data sequence into a second analog signal, and b4. filtering the second analog signal to produce the first analog signal.

* * * * *